US009583242B2

United States Patent
Hozoi et al.

(10) Patent No.: US 9,583,242 B2
(45) Date of Patent: *Feb. 28, 2017

(54) RESISTIVE VOLTAGE DIVIDER WITH HIGH VOLTAGE RATIO

(71) Applicant: ABB AG, Mannheim (DE)

(72) Inventors: Adrian Hozoi, Mannheim (DE); Rolf Disselnkotter, Mauer (DE)

(73) Assignee: ABB AG, Mannheim (DE)

( * ) Notice: Subject to any disclaimer, the term of this patent is extended or adjusted under 35 U.S.C. 154(b) by 0 days.

This patent is subject to a terminal disclaimer.

(21) Appl. No.: 14/962,685

(22) Filed: Dec. 8, 2015

(65) Prior Publication Data

US 2016/0093423 A1    Mar. 31, 2016

Related U.S. Application Data

(63) Continuation of application No. 14/010,035, filed on Aug. 26, 2013, now abandoned, which is a (Continued)

(30) Foreign Application Priority Data

Feb. 25, 2011    (EP) .................................... 11001577

(51) Int. Cl.
*G01R 15/04*    (2006.01)
*H02M 3/06*    (2006.01)
(Continued)

(52) U.S. Cl.
CPC ............. *H01C 13/02* (2013.01); *G01R 15/04* (2013.01); *H01C 7/00* (2013.01); *H01C 17/23* (2013.01);
(Continued)

(58) Field of Classification Search
CPC .... G01R 15/04; G01R 19/0084; H01C 10/16; H01C 13/02; H02M 3/06
See application file for complete search history.

(56) References Cited

U.S. PATENT DOCUMENTS 5,521,576 A    5/1996    Collins
5,929,746 A *  7/1999    Edwards, Jr. ............ H01C 1/14
                                                         338/203
(Continued)

FOREIGN PATENT DOCUMENTS

CN    101577161 A    11/2009
DE    41 23 249 A1    1/1993
(Continued)

OTHER PUBLICATIONS

Gregoire et al., Process-Independent Resistor Temperature-Coefficients Using Series/Parallel and Parallel/Series Composite Resistors, 2007 IEEE, pp. 2826-2829.*
(Continued)

*Primary Examiner* — Toan Le
(74) *Attorney, Agent, or Firm* — Taft Stettinius & Hollister LLP (57)    ABSTRACT

A resistive voltage divider includes at least a first and a second resistor electrically connected in series. The resistors are made of an electrically resistive film material and each resistor is applied as a trace onto an insulating substrate. The divider's voltage ratio has a value between one hundred and one million. In order to achieve these high voltage ratios, a third resistor is electrically connected in parallel with the second resistor. The trace of the second and of the third resistor each overlap on one end at least in part with a first contacting terminal and on the respective other end at least in part with a second contacting terminal. A compact size of
(Continued)

the divider is maintained by arranging the first and second contacting terminals in an interdigitated manner.

20 Claims, 4 Drawing Sheets

Related U.S. Application Data continuation of application No. PCT/EP2012/000779, filed on Feb. 23, 2012.

(51) Int. Cl.
  *H01C 13/02*  (2006.01)
  *H01C 17/23*  (2006.01)
  *H03L 7/087*  (2006.01)
  *H01C 7/00*  (2006.01)
  *H02M 5/06*  (2006.01)

(52) U.S. Cl.
  CPC ............... *H02M 3/06* (2013.01); *H02M 5/06* (2013.01); *H03L 7/087* (2013.01)

(56) References Cited

U.S. PATENT DOCUMENTS

| | | | |
|---|---|---|---|
| 6,111,494 | A | 8/2000 | Fischer et al. |
| 6,258,283 | B1 | 7/2001 | Mikami et al. |
| 6,593,697 | B1 | 7/2003 | Aarnink et al. |
| 7,079,004 | B2 | 7/2006 | Budak et al. |
| 2013/0335106 | A1* | 12/2013 | Hozoi .................... G01R 15/04 324/713 |
| 2013/0342187 | A1* | 12/2013 | Hozoi .................... G01R 15/04 324/120 |
| 2013/0342227 | A1* | 12/2013 | Hozoi .................... H01C 7/003 324/691 |
| 2013/0346004 | A1* | 12/2013 | Hozoi .................... G01R 15/04 702/66 |
| 2014/0043014 | A1 | 2/2014 | Ho et al. |

FOREIGN PATENT DOCUMENTS

| | | |
|---|---|---|
| DE | 195 37 155 A1 | 4/1997 |
| DE | 198 41 164 A1 | 3/2000 |
| EP | 0 536 895 A1 | 4/1993 |
| GB | 735 889 A | 8/1955 |
| GB | 1 539 774 A | 2/1979 |
| WO | WO 01/33602 A1 | 5/2011 |

OTHER PUBLICATIONS

International Search Report (PCT/ISA/210) issued on Apr. 26, 2012, by the European Patent Office as the International Searching Authority for International Application No. PCT/EP2012/000779.
International Search Report (Form PCT/ISA/210) and the Written Opinion of the International Searching Authority (Form PCT/ISA/237) issued on Apr. 27, 2012, by the European Patent Office in the International Application No. PCT/EP2012/000781. (9 pages).
International Search Report (Form PCT/ISA/210) and the Written Opinion of the International Searching Authority (Form PCT/ISA/237) issued on Apr. 27, 2012, by the European Patent Office in the International Application No. PCT/EP2012/000780. (7 pages).
Notification of Transmittal of the International Search Report (Forms PCT/ISA/220 and PCT/ISA/210) and the Written Opinion of the International Searching Authority (Form PCT/ISA/237) issued on Aug. 21, 2012, by the European Patent Office in the International Application No. PCT/EP2012/000818. (10 pages).

* cited by examiner

RESISTIVE VOLTAGE DIVIDER WITH HIGH VOLTAGE RATIO

RELATED APPLICATIONS

This application is a continuation of U.S. application Ser. No. 14/010,035, which was filed on Aug. 26, 2013, and which claims priority as a continuation application under 35 U.S.C. §120 to PCT/EP2012/000779, which was filed as an International Application on Feb. 23, 2012 designating the U.S., and which claims priority to European Application 11001577.3 filed in Europe on Feb. 25, 2011. The entire contents of these applications are hereby incorporated by reference.

FIELD

The present disclosure relates to a resistive voltage divider that includes at least a first and a second resistor electrically connected in series and made of an electrically resistive film material applied as a trace onto an insulating substrate and where the divider's voltage ratio has a value between one hundred and one million. The voltage divider may include in its simplest form two serial resistors, one with a high resistance value and the other with a low resistance value. In more advanced cases, one or both of the serial resistors can be replaced by resistive networks having respective equivalent resistance values. These resistors or corresponding resistor networks may in the following also be called high and low ohmic resistors, respectively.

BACKGROUND

Different techniques are known to manufacture resistors by bringing a non-insulating, electrically resistive film or foil material, such as metal film or metal foil, e.g. nickel chromium, cermet film, e.g. tantalum nitride, ruthenium dioxide, bismuth ruthenate, carbon film, or a film of composite material based on a mixture of glass and cermet onto an insulating substrate. In rare cases, the electrically resistive film material may include multiple layers of different of the above named materials. The insulating substrate can be ceramic, silicon, glass or some other synthetic material, and the film material is applied to the substrate by methods such as sputtering (thin film), screen and stencil printing (thick film) or direct printing through a nozzle (thick film). The insulating substrate may have the form of a flat planar sheet or of a cylinder, and accordingly the resistive film is deposited either onto a two-dimensional planar surface or onto a three-dimensional axially symmetric surface. In the voltage divider, both the high and low ohmic resistors are brought onto the same substrate. In addition, highly conductive structures with considerable lower resistivity than the film material of the resistors are deposited on the substrate as well. The highly conductive structures are intended to be used as contacting terminals, and they are placed on the substrate in such a way that the resistive film material of the resistors overlaps partly with them.

In order to achieve voltage ratios of significantly more than unity and at the same time reduce the size of the voltage divider, it is known to arrange the resistive film material of the high ohmic resistor in a long and narrow trace, where the trace is shaped like a meandering form. The term meandering form means that the trace is not just a straight line but curved in such a way that a long length is achieved on a small substrate area. The meandering form may look for example like a square wave, a triangle wave, a sine wave or something more irregular like a serpentine, a zigzag or—in the three-dimensional case—a helical form. This is for example described in U.S. Pat. No. 5,521,576 for thick film resistors and in U.S. Pat. No. 7,079,004 B2 for thin film AC voltage dividers. As is disclosed there as well, the low resistance value of the low ohmic resistor is commonly obtained by arranging the resistive film material in a short and wide trace.

In general, the above described resistive voltage dividers can be used for a wide range of voltage levels, from low over medium up to high voltage applications. While the novel exemplary embodiments of the present disclosure originates from the area of medium voltage sensors, such as the KEVCD and KEVA sensor types by ABB, which are commonly applicable to a voltage range between 3.6 kV and 36 kV, its area of application is not limited to this voltage range.

For medium and high voltage applications of up to one megavolt, voltage ratios of up to several hundred thousand are commonly required in order to step down the quantity which is to be measured to the voltage level of the processing electronics. A possibility to achieve higher voltage ratios is to increase the length of the high ohmic resistor. However, there are limits with respect to the available substrate area and the acceptable size of the voltage divider. It is also possible to reduce the length of the trace of the low ohmic resistor. However, there are technological limitations for the minimum trace length and for the minimum spacing between the connecting terminals. Even though these possibilities exist, it needs to be ascertained that currently, resistive dividers with voltage ratios above twenty thousand are hardly available. Thus, their application in voltage sensors rated for voltage ranges in excess of 36 kV has been limited up to now.

SUMMARY

An exemplary resistive voltage divider is disclosed, comprising: at least a first and a second resistor electrically connected in series, made of an electrically resistive film material and each applied as a trace onto an insulating substrate; and a third resistor is electrically connected in parallel with the second resistor, the trace of the second and a trace of the third resistor each overlap on one end at least in part with a first contacting terminal and on a respective other end at least in part with a second contacting terminal, wherein the first and second contacting terminals are arranged in an interdigitated manner, and wherein a voltage ratio of the divider is a value between one hundred and one million.

BRIEF DESCRIPTION OF THE DRAWINGS

Further embodiments of the invention will become apparent from the appended drawings and the corresponding description.

DETAILED DESCRIPTION

Accordingly, exemplary embodiments of the present disclosure provide a resistive voltage divider as described above which has a voltage ratio up to one million and is compact in its size.

The high voltage ratio is significantly increased by replacing the commonly known short and wide trace of the low ohmic resistor by a network of at least two resistors electrically connected in parallel. In order to maintain a compact size, an exemplary embodiment suggests arranging the two contacting terminals of the low ohmic resistor in an interdigitated manner, without the terminals touching each other. The traces of the two resistors each overlap at their respective ends with one of the contacting terminals, either partly or fully. For more than two parallel resistors, the two contacting terminals are both arranged in a kind of comb-shaped form, their teeth being arranged in an interdigitated manner without touching each other and the multiple resistors are placed between the teeth and overlap with the teeth.

According to an exemplary embodiment, a network of two parallel resistors, e.g., a second and a third resistor, are arranged in the following way: the trace of the second resistor overlaps on one end at least in part with a first protrusion of a first contacting terminal and on the other end with a first boundary of a first recess provided in a second contacting terminal, and the trace of the third resistor overlaps on one end at least in part with the first protrusion and on the other end with a second boundary of the first recess, where the first and the second boundaries face each other. Any suitable number of further resistors can be placed in parallel with the second and third resistors by just adding more teeth to the comb-shapes of the two contacting terminals. For an embodiment with three parallel resistors, an exemplary embodiment of the present disclosure suggests that in addition the trace of a fourth resistor overlaps on one end at least in part with the second boundary of the first recess and on the other end with a second protrusion of the first contacting terminal.

According to another exemplary embodiment, a network of four parallel resistors is achieved by arranging a fifth resistor such that its trace overlaps on one end at least in part with the second protrusion and on the other end with a third boundary of a second recess provided in the second contacting terminal, where the second and third boundaries face each other and are both part of the second recess.

High voltage ratios can also be achieved by using significantly different resistive film materials for the high and low ohmic resistors, as is known from the art. However, this results in additional process steps and errors during the manufacturing of the voltage divider and accordingly in increased costs and reduced accuracy.

The use of different resistive film materials in deteriorates the initial accuracy, the temperature stability, and the long term stability of the voltage ratio. This is due to the fact that with different materials it is more difficult to achieve good initial accuracy of the voltage ratio, so that post-processing operations, such as laser trimming of one or of both the high and low ohmic resistors, are called on to adjust the accuracy. Furthermore, it can no longer be ensured that the drifting of the operating characteristics of both the high and the low ohmic resistors occur in the same direction and with possibly the same amount so that the ratio of the resistance values and thereby the divider's voltage ratio can no longer be maintained at its initial value over changing temperature or over a long period of time.

To overcome these drawbacks, it is suggested in a preferred embodiment of the invention to always use the same resistive film material for all the resistors in the divider. In case of composite materials, this means for example to use not only the same kind of composite but the same composite with exactly the same resistivity. As a result, the initial accuracy, the temperature and the long term stability of the voltage ratio are increased, and the manufacturing of the high and low ohmic resistors may occur within one and the same series of process steps, which not only is more cost effective but also leads to the same trace thickness for the high and the low ohmic resistors, thereby increasing the accuracy even further.

The parallel resistor traces of the low ohmic resistor may have differing lengths, depending on the distances between the teeth of the comb-shaped contacting terminals. However, in an exemplary embodiment described herein, the second and further resistors have a similar trace length, meaning that the trace lengths may vary within certain limits around a predefined average trace length. A preferred limit is that the shortest trace length may not be shorter than half of the longest trace length.

A further advantage can be achieved when the drifting characteristics of the high and low ohmic resistors in the voltage divider are matched even further, thereby allowing for a further improved temperature stability and long term stability of the voltage ratio. Using the same resistive film material is a first step in that direction. The exemplary embodiments of the present disclosure take into account different effects, which may influence the initial value and/or the drifting characteristics of the voltage ratio. For example, exemplary embodiments described herein can include high and low ohmic resistors designed such that the effects occur in all resistors to possibly the same extent.

One effect which has an impact on the resistance values is the so called edge effect occurring at the lateral edges of the trace. When looking at the cross section of a known trace design, the lateral edges of the trace are usually not straight and cut sharply, but rather gradually decreasing towards the outer ends. In the edge region of the trace, it is likely that the composition and/or the structure of the electrically resistive film material are slightly altered with respect to the region in the middle of the trace. Accordingly, it can be noted that with decreasing trace width the edge effect plays a larger role in affecting the trace resistance per unit length compared to the expected resistance of an ideal trace with rectangular cross section and homogenous composition and structure. In order to have the same amount of influence of the edge effect on the resistance value of the high and low ohmic resistors, it is therefore advantageous to provide the resistors with the same trace width, thereby ensuring superior matching of their resistance values and accordingly improved initial accuracy, temperature stability and long term stability. However, it may be necessary to make compromises between the trace width and, for example, the available substrate area, or the desired resistance values. In these cases, it is suggested to design the high and low ohmic resistors such that they have a similar trace width, meaning that the trace widths may vary within certain limits around a predefined average trace width. A preferred limit is that the narrowest trace width may not be narrower than half of the widest trace width.

In an exemplary embodiment, where the high and low ohmic resistors can have the same trace width, it is suggested to place at least one further resistor trace geometrically in parallel with the trace of the second resistor, where the ends of its trace overlap at least in part with the first protrusion and the first boundary, respectively. This concept can be extended as far as is specified by design criteria of the voltage divider, e.g. multiple rows of resistor traces may be placed geometrically in parallel, all of them overlapping with the teeth of the comb-shapes of the contacting terminals.

Further effects which play a role in affecting the resistivity of the resistive film material are related to the fabrication techniques. For example, when the resistors are screen printed using thick film technology, the direction of the mechanical movement of the screen over the insulating surface establishes a certain anisotropic behavior of the resulting trace resistance per unit length, depending on the printing direction.

Anisotropic behavior is also unavoidable when thin film technology is used, since the sputtering angle over the substrate area is not perfectly perpendicular and constant but varies slightly. In addition, mechanical stresses, which may occur during the fabrication, in particular during packaging and when electrical connections are made to the contacting terminals, as well as during the lifetime of the voltage divider are often of anisotropic nature. Anisotropic stresses may be more pronounced for three-dimensional, e.g. cylindrical, voltage dividers, than for two-dimensional, flat voltage dividers. In order to affect the high and low ohmic resistors in the same anisotropic way, another exemplary embodiment of the present disclosure includes an arrangement of dominant trace segments of the resistors with approximately the same orientation and where the dominant trace segments enclose an angle between zero and a of maximum thirty degrees. The term dominant trace segment is used for those parts of a meandering trace which are of considerable length, opposed to just the bends, and which have the highest impact on the overall resistance value of that trace compared to other trace segments. In case of a straight line, the dominant trace segment and the trace itself are the same.

Figure 1:
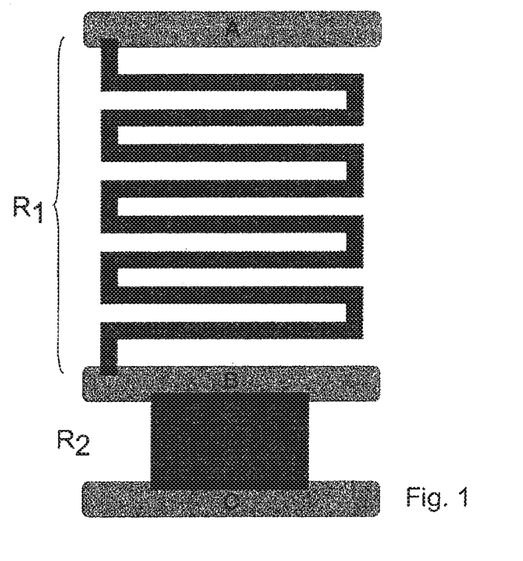
FIG. 1 shows a known resistive voltage divider with high and low ohmic resistors.

FIG. 1 shows a known resistive voltage divider with high and low ohmic resistors. The high ohmic resistor with a resistance value $R_1$ has a long and narrow trace with multiple bends and where the low ohmic resistor with a resistance value $R_2$ has a short and wide trace. The high ohmic resistor is placed between a third contacting terminal A and a first contacting terminal B and the low ohmic resistor between the first contacting terminal B and a second contacting terminal C. The resistive film material used for the high and low ohmic resistors differs here.

Figure 2:
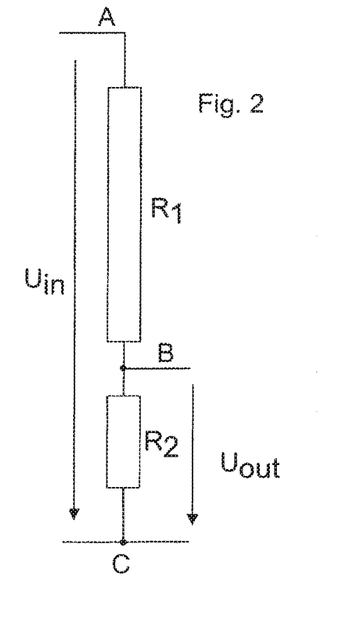
FIG. 2 shows a known schematic electrical diagram of the use of a resistive voltage divider for measurement purposes.

FIG. 2 shows a known schematic electrical diagram of the use of the resistive voltage divider of FIG. 1 for measurement purposes. Such a voltage divider is for example used in voltage sensors for the medium voltage range between 3.6 kV and 36 kV, such as the KEVCD and KEVA sensor types by ABB. In voltage sensors, an input voltage $U_{in}$, which represents the quantity to be measured, is applied between the third and second contacting terminals A and C, and an output voltage $U_{out}$, having a much smaller value usually reduced by a factor equal to the voltage divider's ratio $(R_1+R_2)/R_2$, is then delivered to electronic circuitry in order to be processed and transformed into a measurement value.

Figure 3:
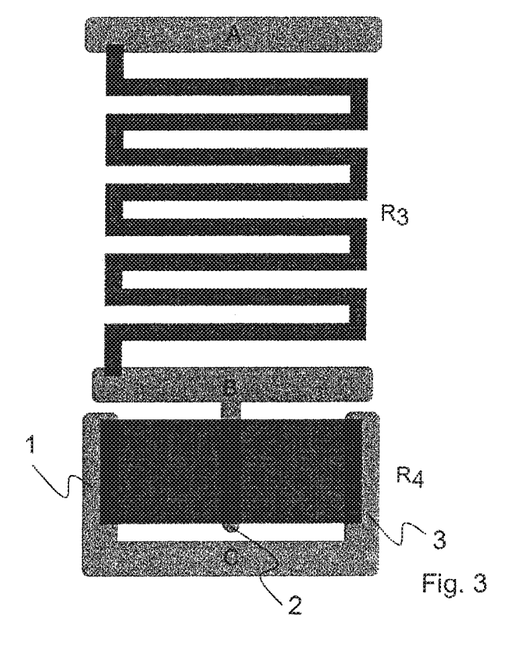
FIG. 3 shows a first resistive voltage divider according to an exemplary embodiment of the present disclosure.
Figure 4:
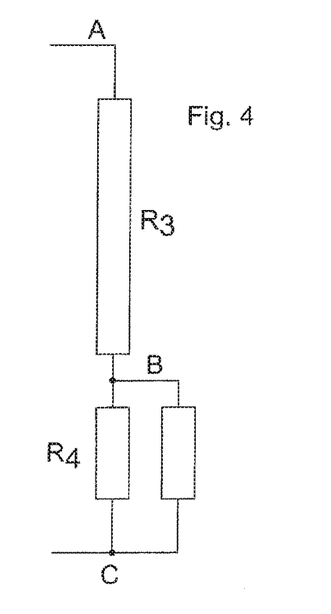
FIG. 4 shows a schematic electrical diagram of the first resistive voltage divider in according to an exemplary embodiment of the present disclosure.

FIG. 3 shows a first resistive voltage divider according to an exemplary embodiment of the present disclosure. As shown in FIG. 3, the high ohmic resistor and the low ohmic resistor are made of the same electrically resistive film material and the resistance value $R_4$ of the low ohmic resistor is achieved by a network of two electrically parallel resistors. The high ohmic resistor may also be called first resistor and has a resistance value $R_3$. In FIG. 3, the first contacting terminal B has a first protrusion 2 which extends into a first recess made within the second contacting terminal C, where the first recess has a first boundary 1 and a second boundary 3 that face each other. A wide and straight trace line extends from the first boundary 1 across the first protrusion 2 to the second boundary 3 and overlaps partly with the boundaries, thereby forming a second resistor between first boundary 1 and first protrusion 2 and a third resistor between first protrusion 2 and second boundary 3. By this arrangement, the second and third resistors are electrically connected in parallel, as is shown in the schematic electrical diagram of FIG. 4. The resulting resistance value of this parallel connection is the resistance value $R_4$ of the low ohmic resistor, and the voltage ratio of the divider is $(R_3+R_4)/R_4$. The resistance value $R_4$ is decreased compared to $R_2$ of FIG. 1, due to the parallel connection of two resistor traces with approximately the same length and width as the one resistor trace of FIG. 1, thereby increasing the voltage ratio, in case that the resistance values $R_3$ and of the high ohmic resistors are about the same.

Figure 5:
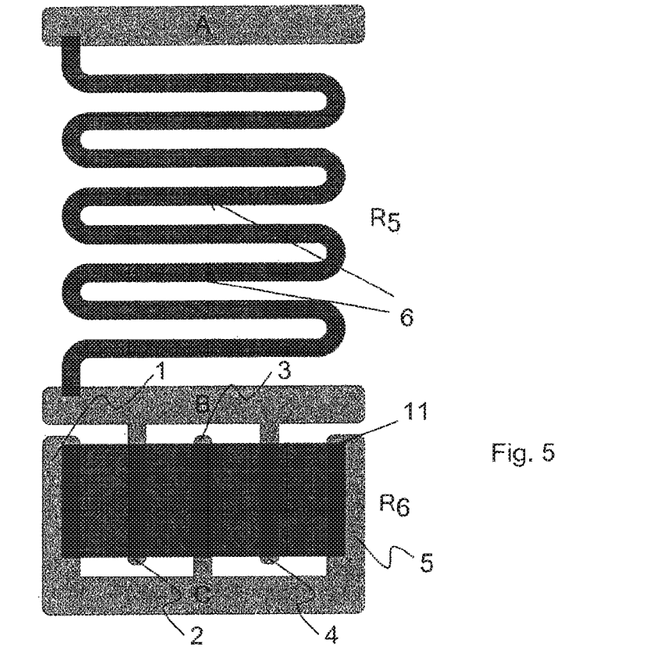
FIG. 5 shows a second resistive voltage divider according to an exemplary embodiment of the present disclosure.
Figure 6:
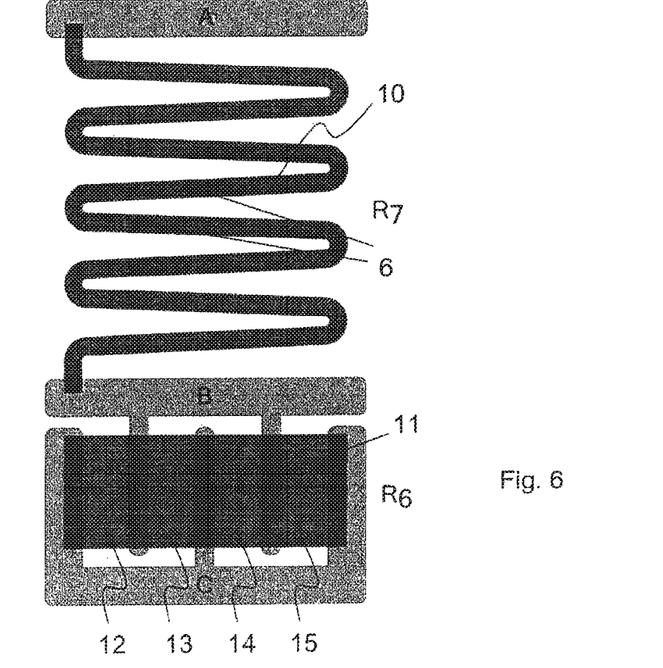
FIG. 6 shows a third resistive voltage divider according to an exemplary embodiment of the present disclosure.
Figure 7:
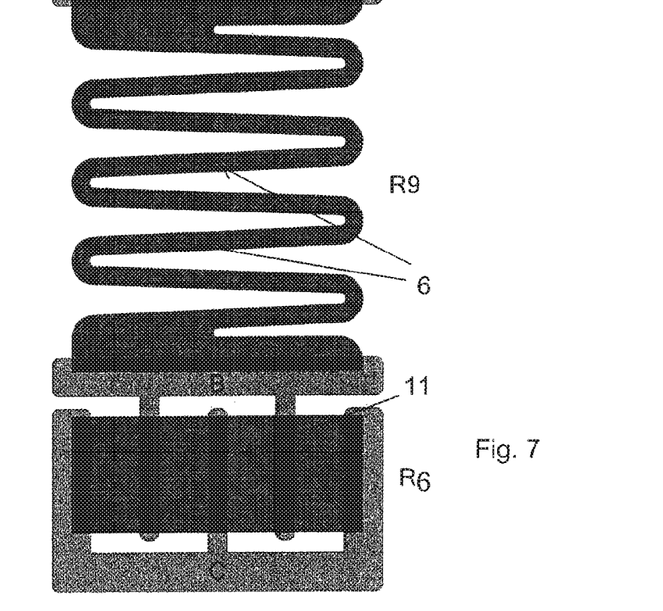
FIG. 7 shows a fourth resistive voltage divider according to an exemplary embodiment of the present disclosure.

FIGS. 5 shows a second resistive voltage divider according to an exemplary embodiment of the present disclosure; FIG. 6 shows a third resistive voltage divider according to an exemplary embodiment of the present disclosure; and FIG. 7 shows a fourth resistive voltage divider according to an exemplary embodiment of the present disclosure. In FIGS. 5, 6, and 7, the voltage ratio is further increased by connecting a fourth and fifth resistor in parallel with the second and third resistors. As can be seen in all three figures, in addition to the first protrusion 2 and the first recess with first and second boundaries 1 and 3, a second protrusion 4 extends into a second recess having a third boundary 5 and sharing the second boundary 3 with the first recess. From FIGS. 5, 6, and 7, it becomes apparent that the first and second contacting terminals B and C have a comb-shaped form with their teeth being arranged in an interdigitated manner without touching each other. Again, a thick and straight trace line extends between the outer boundaries, here the first boundary 1 and the third boundary 5, overlapping with them in part as well as overlapping wholly with the inner boundary 3 and the two protrusions 2 and 4. In that way, the second resistor 12 (see FIG. 6) is again formed between the first protrusion 2 and the first boundary 1 and the third resistor 13 is formed between the first protrusion 2 and the second boundary 3. The fourth resistor 14 is formed between the second boundary 3 and the second protrusion 4 and the fifth resistor 15 between the second protrusion 4 and the third boundary 5. For the sake of clarity, the trace of the high ohmic resistor which is also called the first resistor is indicated in FIG. 6 by reference 10.

The resistance value $R_6$ of the low ohmic resistor, which is made up by the parallel network of the second, third, fourth and fifth resistors, is further reduced compared to the resistance value $R_4$ of the exemplary first resistive voltage divider, thereby increasing the voltage ratio $(R_5+R_6)/R_6$. The high ohmic resistors in FIGS. 5, 6 and 7 are no longer formed as a square wave, but as meandering forms with round corners at the bends. Accordingly, the corresponding resistance values $R_5$, $R_7$ and $R_9$, respectively, differ slightly from the resistance value $R_3$ of the first resistive voltage divider. The dominant traces 6 of the high ohmic resistor in FIG. 5 include with the resistor traces 11 of the low ohmic resistor an angle of zero degrees. In FIGS. 6 and 7, this angle has a value above zero and below thirty degrees. Apart from that, the exemplary fourth resistive voltage divider of FIG. 7 shows a special design solution for the interface areas between the trace of the high ohmic resistor and the third and first contacting terminals A and B.

Figure 8:
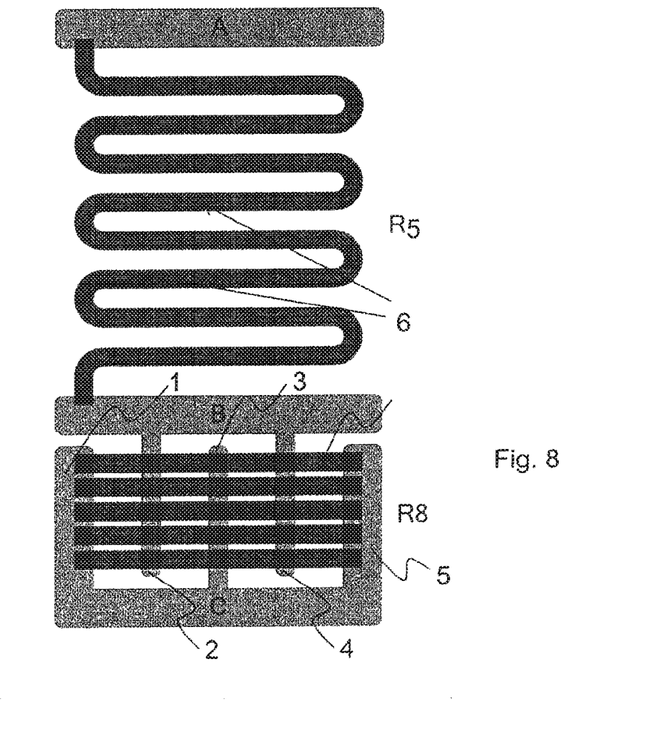
FIG. 8 shows a fifth resistive voltage divider according to an exemplary embodiment of the present disclosure.

The exemplary fifth resistive voltage divider shown in FIG. 8 differs from the exemplary second resistive voltage divider of FIG. 5 in that the low ohmic resistor is formed by the electrical network of twenty resistors connected in parallel. This is achieved by placing four further trace lines geometrically in parallel with the trace line 7 which includes the second, third, fourth and fifth resistors.

In the exemplary embodiments shown in FIGS. 3 and 5 to 8, the resistive film material of the resistor traces overlaps at least in part with the corresponding contacting terminals A, B, and C, respectively, by being placed on top of the contacting terminals. According to another exemplary embodiment of the present disclosure, the overlap may of course be achieved by putting the contacting terminals on top.

FIG. 8 shows a fifth resistive voltage divider according to an exemplary embodiment of the present disclosure. As shown in FIG. 8, the accuracy and long term stability of the voltage ratio $(R_5+R_6)/R_6$ can be ensured in an even better way by using in addition the same trace width.

Figure 9:
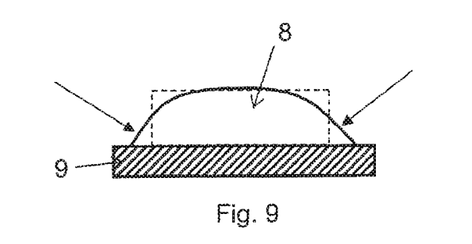
FIG. 9 shows a schematic cross-section view of a resistor trace according to an exemplary embodiment of the present disclosure.

FIG. 9 shows a schematic cross-section view of a resistor trace according to an exemplary embodiment of the present disclosure. As shown in FIG. 9, a real resistor trace is depicted with a solid line and an ideal resistor trace is represented by a dotted line. Reference 8 indicates the resistive film material and reference 9 the insulating substrate. The arrows indicate the areas at the edges of the trace width where the so called edge effects occur. The size of these areas is approximately the same for all trace widths which means that the real resistance value differs more from the ideal resistance value for smaller trace widths. According to the exemplary embodiments of FIGS. 5, 6 and 7, where the trace width of the low ohmic resistor is much larger than the trace width of the respective high ohmic resistors, the resistance values $R_5$, $R_7$, and $R_9$ are more strongly affected by the edge effect than the resistance value $R_6$. Therefore, in order to match the impact of the edge effect on the resistance values, both the high and low ohmic resistors of FIG. 8 are provided with the same trace width.

Figure 10:
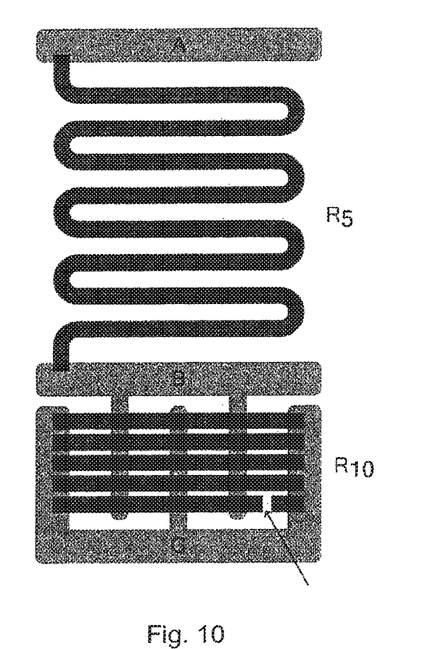
FIGS. 10 and 11 show the trimming of a low ohmic resistor according to an exemplary embodiment of the present disclosure.
Figure 11:
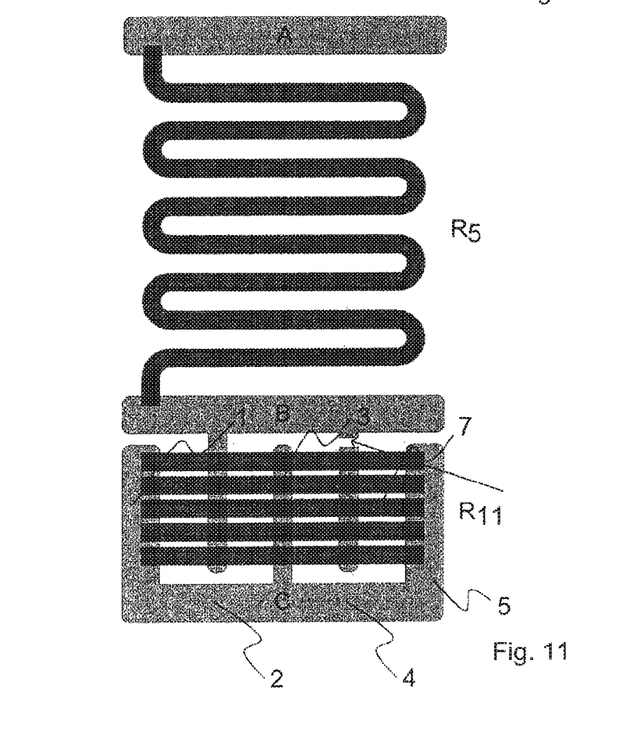

FIGS. 10 and 11 show the trimming of a low ohmic resistor according to exemplary embodiments of the present disclosure. FIG. 10 illustrates an exemplary sixth resistive voltage divider where one of the resistor traces belonging to the low ohmic resistor is interrupted by cutting it in two pieces, as indicated by the solid arrow. In that way, one of the resistors of the corresponding parallel resistor network is eliminated, thereby increasing the resistance value by one increment from the value $R_8$ (see FIG. 8) to the value $R_0$. FIG. 11 illustrates a seventh resistive voltage divider in which the second protrusion 4 is cut in two pieces, thereby eliminating all eight resistors which overlap with the second protrusion 4 from the resistor network, resulting in a resistance value R which is twice as big as the value $R_8$. The adjustment of the resistance value of a film resistor by erasing part of the resistive film material is known in the art as trimming. It may be noted that the design of the low ohmic resistor as a network of parallel resistor traces allows the trimming in a kind of digital manner by taking away whole resistors from the resistor network, as opposed to analogue trimming which is achieved by erasing the resistive film material of a resistor trace only partly, as for example described in U.S. Pat. No. 7,079,004. Analogue trimming leaves behind cutting edges within the resistor's film material which may alter the microstructure of the material and may induce stresses, both usually affecting the stability of the resistance value. These negative effects can be avoided by applying digital trimming instead.

It will be obvious to a person skilled in the art that the exemplary embodiments can be implemented in various ways. The disclosure and its embodiments are not limited to the examples described above but may vary within the scope of the claims.

Thus, it will be appreciated by those skilled in the art that the present invention can be embodied in other specific forms without departing from the spirit or essential characteristics thereof. The presently disclosed embodiments are therefore considered in all respects to be illustrative and not restrictive. The scope of the invention is indicated by the appended claims rather than the foregoing description and all changes that come within the meaning and range and equivalence thereof are intended to be embraced therein.

What is claimed is:

1. A resistive voltage divider comprising:
   at least a first resistor and a second resistor electrically connected in series, each of the first and second resistors being made of an electrically resistive film material and each applied as a trace onto an insulating substrate; and
   a third resistor electrically connected in parallel with the second resistor, the trace of the second resistor and a trace of the third resistor each overlapping on one end at least in part with a first contacting terminal and on a respective other end at least in part with a second contacting terminal,
   wherein each of the first and second contacting terminals extends in a first direction,
   wherein the first contacting terminal has at least one first protrusion extending in a second direction perpendicular to the first direction, and the second contacting terminal has at least one second protrusion extending in a third direction perpendicular to the first direction, the second direction being opposite to the third direction,
   wherein the first and second contacting terminals are arranged in an interdigitated manner in which the first and second protrusions of the first and second contacting terminals respectively extend in the opposite second and third directions without contacting each other, and
   wherein a voltage ratio of the divider is a value between one hundred and one million.

2. The resistive voltage divider of claim 1, wherein the trace of the second resistor overlaps on one end at least in part with a first protrusion of the first contacting terminal and on the other end at least in part with a first boundary of a first recess provided in the second contacting terminal, and the trace of the third resistor overlaps on one end at least in part with the first protrusion and on another end at least in part with a second boundary of the first recess, and wherein the first and the second boundaries face each other.

3. The resistive voltage divider according to claim 2, wherein the trace of a fourth resistor overlaps on one end at least in part with the second boundary of the first recess and on another end at least in part with a second protrusion of the first contacting terminal.

4. The resistive voltage divider according to claim 3, wherein the trace of a fifth resistor overlaps on one end at least in part with the second protrusion and on another end at least in part with a third boundary of a second recess provided in the second contacting terminal, wherein the second and third boundaries face each other and are both part of the second recess.

5. The resistive voltage divider according to claim 2, wherein the trace of at least one further resistor is placed geometrically in parallel with the trace of the second resistor and ends of the trace of the second resistor overlap at least in part with the first protrusion and the first boundary, respectively.

6. The resistive voltage divider according to claim 2, wherein the resistors are made of the same electrically resistive film material.

7. The resistive voltage divider according to claim 2, wherein the second and further resistors have a similar trace length.

8. The resistive voltage divider according to claim 1, wherein the trace of at least one further resistor is placed geometrically in parallel with the trace of the second resistor and ends of the trace of the second resistor overlap at least in part with the first protrusion and the first boundary, respectively.

9. The resistive voltage divider according to claim 1, wherein the resistors are made of the same electrically resistive film material.

10. The resistive voltage divider according to claim 1, wherein the second and further resistors have a similar trace length.

11. The resistive voltage divider according to claim 1, wherein the resistors have a similar trace width.

12. A voltage sensor comprising:
a resistive voltage divider according to claim 11.

13. The resistive voltage divider according to claim 1, wherein the first resistor is arranged in a meandering shape.

14. The resistive voltage divider according to claim 1, wherein dominant trace segments of the resistors are arranged with approximately a same orientation and the dominant trace segments enclose an angle between zero and thirty degrees.

15. The resistive voltage divider according to claim 1, wherein the trace of at least one of the second and any further resistor is cut in two pieces for trimming purposes.

16. The resistive voltage divider according to claim 1, wherein at least one of the first and any further protrusion is cut in two pieces for trimming purposes.

17. The resistive voltage divider according to claim 1, wherein at least one of the first and any further boundary is cut in two pieces for trimming purposes.

18. The resistive voltage divider according to claim 1, wherein the resistors have a similar trace width.

19. The resistive voltage divider according to claim 1, wherein the first resistor is arranged in a meandering shape.

20. The resistive voltage divider according to claim 1, wherein dominant trace segments of the resistors are arranged with approximately a same orientation and the dominant trace segments enclose an angle between zero and thirty degrees.

* * * * *